(12) United States Patent
Oser et al.

(10) Patent No.: US 9,410,240 B2
(45) Date of Patent: Aug. 9, 2016

(54) PROCESS FOR PRODUCING METALLIZED MULTI-LAYER BODIES FROM SPECIAL POLYCARBONATES

(71) Applicant: BAYER INTELLECTUAL PROPERTY GMBH, Monheim (DE)

(72) Inventors: Rafael Oser, Krefeld (DE); Alexander Meyer, Düsseldorf (DE)

(73) Assignee: BAYER INTELLECTUAL PROPERTY GMBH, Monheim (DE)

( * ) Notice: Subject to any disclaimer, the term of this patent is extended or adjusted under 35 U.S.C. 154(b) by 0 days.

(21) Appl. No.: 14/349,389

(22) PCT Filed: Oct. 5, 2012

(86) PCT No.: PCT/EP2012/069734
§ 371 (c)(1),
(2) Date: Apr. 3, 2014

(87) PCT Pub. No.: WO2013/050538
PCT Pub. Date: Apr. 11, 2013

(65) Prior Publication Data
US 2014/0234601 A1 Aug. 21, 2014

(30) Foreign Application Priority Data
Oct. 7, 2011 (EP) ..................................... 11184318

(51) Int. Cl.
*C23C 14/00* (2006.01)
*C23C 14/35* (2006.01)
*C23C 14/20* (2006.01)
*C08L 69/00* (2006.01)
*C23C 14/02* (2006.01)

(52) U.S. Cl.
CPC ............... *C23C 14/35* (2013.01); *C23C 14/022* (2013.01); *C23C 14/205* (2013.01); *C08L 69/00* (2013.01); *C23C 14/025* (2013.01); *Y10T 428/24967* (2015.01); *Y10T 428/31507* (2015.04)

(58) Field of Classification Search
CPC ............................. C08L 69/00; C23C 14/025
See application file for complete search history.

(56) References Cited

U.S. PATENT DOCUMENTS

| | | | |
|---|---|---|---|
| 6,562,715 B1 * | 5/2003 | Chen et al. | 438/643 |
| 2011/0143126 A1 * | 6/2011 | Meyer et al. | 428/334 |

* cited by examiner

*Primary Examiner* — Keith Hendricks
*Assistant Examiner* — Timon Wanga
(74) *Attorney, Agent, or Firm* — McBee Moore Woodward Vanik IP, LLC

(57) ABSTRACT

The invention relates to a process for producing multi-layer bodies which carry at least one metal layer. The invention further relates to multi-layer products having at least three layers, comprising a substrate layer made of a substrate and containing special copolycarbonates, a metal layer and at least one additional layer.

16 Claims, No Drawings

PROCESS FOR PRODUCING METALLIZED MULTI-LAYER BODIES FROM SPECIAL POLYCARBONATES

CROSS REFERENCE TO RELATED APPLICATIONS

This application is a §371 National Stage Application of PCT/EP2012/069734, filed Oct. 5, 2012 which claims priority to EP 11184318.1, filed Oct. 7, 2011.

BACKGROUND

1. Field of the Invention

The invention relates to a process for the production of multilayer structures which bear at least one metal layer. The invention further relates to multilayer products comprising at least three layers which comprise a substrate layer made of a substrate comprising specific copolycarbonates, a metal layer, and at least one other layer.

2. Description of Related Art

Because polycarbonates have high heat resistance they are used inter alia in fields where a relatively high level of thermal stress is likely to occur. Specific copolycarbonates can be used to achieve a further increase in heat resistance (an example being a copolycarbonate based on bisphenol A and bisphenol TMC (1,1-bis(4-hydroxyphenyl)-3,3,5-trimethylcyclohexane)). Said polycarbonates are therefore also suitable for the production of lenses, reflectors, lamp covers, and lamp housings, etc., where these have a relatively high level of exposure to thermal stress. These applications practically always demand a relatively high level of thermal properties, for example high Vicat softening point (heat resistance) or high glass transition point combined with adequate mechanical properties.

Polycarbonates made of bisphenol A and bisphenol TMC are attainable commercially with trademark Apec® from Bayer Materialscience AG.

The application of metals to the polymer can be achieved by way of various methods, for example by vapor deposition or by sputtering. The processes are described in more detail by way of example in "Vakuumbeschichtung Bd.1 bis 5 [Vacuum coating, Vols. 1 to 5]", H. Frey, VDI-Verlag Dusseldorf 1995 or "Oberflächen- and Dünnschicht-Technologie [Technology of surfaces and thin layers]" Part 1, R. A. Haefer, Springer Verlag 1987.

In order to achieve better metal adhesion and in order to clean the substrate surface, the substrates are normally subjected to plasma pretreatment. Plasma pretreatment can sometimes alter the surface properties of polymers. These methods are by way of example described by Friedrich et al. in Metallized plastics 5 & 6: Fundamental and applied aspects and H. Grünwald et al. in Surface and Coatings Technologiy 111 (1999) 287-296.

Further layers such as corrosion-reducing protective sizes can be applied in a PECVD (plasma enhanced chemical vapor deposition) or plasma polymerization process. Here, low-boiling-point precursors mainly based on siloxane are vaporized into a plasma and thus activated, so that they can form a film. Typical substances here are hexamethyldisiloxane (HMDSO), tetramethyldisiloxane, decamethylcyclopentasiloxane, octamethylcyclotetrasiloxane and trimethoximethylsilane.

Copolycarbonates based on cycloalkylidenediphenols are known and have been described various publications.

DE 3 903 103 A1, EP 414 083 A2, and EP 359 953 A1 describe the production and use of polycarbonates based on cycloalkylidenediphenols.

Many compositions comprising copolycarbonates with cycloalkylidenediphenols and various other polymeric components have also been described.

EP 362 646 A2 describes blends of copolycarbonates with cycloalkylidenediphenols and with rubbers.

EP 401 629 A2 describes blends with high temperature resistance made of copolycarbonates comprising cycloalkylidenebisphenols and ABS polymers.

None of said applications describes improved optical properties in metalized moldings at temperatures above 160° C. No publication describes processes for production of metalized moldings. The available prior art does not reveal any way of solving the problem described above.

U.S. Pat. No. 7,128,959 B2 describes metalized moldings. Substrate material that can be used here comprises polycarbonates polysulfones, or polyetherimides, or a mixture of these. In order to ensure good metalization, it is necessary to apply a base layer to the respective substrate prior to metalization. The problem described here cannot be solved by applying a base layer. The application of a base layer is not necessary in the case of the composition described in the present invention.

These materials must not only have good processability and good mechanical properties but must also comply with other requirements such as good surface quality in the resultant injection-molded part/extrudate, and also good metal adhesion.

Heat resistance and mechanical properties can be varied widely, depending on bisphenols used and on suitable adjustment of the molecular weight of the copolycarbonates. However, there continues to be a requirement for a further improvement in metal adhesion for certain applications. Specifically in the field of reflectors, good metal adhesion is essential.

As described above, the corresponding metalized parts must have high temperature resistance. No fall-off is permissible in either mechanical properties or optical properties, for example the quality of the metal surface. It has been found, however, that metalized moldings made of specific copolycarbonates which have Vicat softening points above 160° C., in particular above 170° C., and which comprise inter alia 1,1-bis(4-hydroxyphenyl)cyclohexane derivatives often lack adequate optical quality for specific applications at very high temperatures. Surprisingly, therefore, moldings of this type which have been pretreated and metalized under specific conditions, in particular under plasma conditions, have a tendency toward blistering under specific conditions (blistering and cracking of the coating) at high temperatures (in particular at temperatures or temperature peaks above 170° C.). This can lead to failure of the corresponding molding in the respective application. The blistering causes the metal surface to lose its uniform appearance—reflection of light is moreover adversely affected.

Surprisingly, this phenomenon occurs in particular when the abovementioned copolycarbonates comprise certain additives such as certain heat stabilizers or certain pigments such as titanium dioxide. Heat stabilizers normally serve to protect the substrate material from effects of heat, but certain heat stabilizers surprisingly achieve an opposite effect. However, titanium dioxide is used with the aim of establishing a certain color in resultant moldings and is therefore an important constituent of colored compositions. In the event that titanium dioxide is used, the amount used of titanium dioxide is from 0.10% by weight to 2.50% by weight, preferably from 0.20% by weight to 1.50% by weight and with particular preference from 0.80% by weight to 1.40% by weight, based in each case on the weight of the copolycarbonate. A result of omitting titanium dioxide and/or heat stabilizers is use of other pigments and compounds which are markedly more expensive and thus render the process less economic and/or are unstable on aging. Other colorants or pigments can be used alongside titanium dioxide, for example carbon black. An example of a color frequently desired in the field of electronics is gray (an example being what is known as "electrical gray"). Pigments of this type based on titanium dioxide are normally inert, but surprisingly the presence of these pigments leads to drastically impaired surface quality after thermal stress.

However, the phenomenon also occurs in the absence of these heat stabilizers or pigments, and the processes known hitherto from the prior art do not therefore ensure that the copolycarbonates remain defect-free at an elevated temperature.

SUMMARY

It was therefore an object to develop a process for providing a stable metal layer to polycarbonates or polycarbonate compositions with glass transition temperatures above 160° C., preferably above 170° C., which comprise at least 60% of copolycarbonates based on 1,1-bis(4-hydroxyphenyl)cyclohexane derivatives in a DC sputtering process which ensures that metal surfaces are reliably attained that are defect-free even after a high level of thermal stress, i.e. stress at temperatures above 160° C.

Another object was to develop a multilayer structure which comprises a substrate material comprising at least 60% by weight of copolycarbonates based on 1,1-bis(4-hydroxyphenyl)cyclohexane derivatives and also at least one metal layer, and also one further layer and which have excellent surface quality and which retain the surface quality at high temperatures.

Surprisingly, specific DC sputtering methods, and in particular sputtering methods which operate with specific plasma-assisted pretreatment methods, lead to development of defects in the subsequent metal layer on heat treatment. This could not have been expected. It must be emphasized that the meaning of the expression good metalizability covers not only general metal adhesion but also blistering (formation of blister-type defects). Metal adhesion itself can be achieved even with low pretreatment energies. Metal adhesion can be tested by way of example by a peel test (adhesive-tape peel test). However, blistering after heat treatment can only be prevented by the process of the invention.

The meaning of the expression defective surfaces after thermal stress covers primarily blisters, which result in disruption of the metallic surface. Another possible result is formation of a clouded metal surface after thermal stress. Another defect that can occur is surface iridescence after thermal stress. All of these defects occur only when the metalized structure is subjected to thermal stress—it is not therefore possible to discern beforehand, i.e. directly after metalization, whether a metalized molding will develop surface defects.

It was moreover surprising that not every metalization process leads to damage to the surface on exposure to thermal stress. If the corresponding metal is applied only from a vapor and the substrate here is not exposed to any of the ion bombardment that takes place in low-frequency plasma pretreatment or in DC sputtering, the polymer-metal bond is very stable and, on exposure to thermal stress, there is no resultant development of defective surfaces. The surface defects occur when the injection-molded parts have been coated in the plasma in a DC sputtering process. However, here again it is not every plasma-assisted process that leads to a subsequent defective surface. A further low-frequency plasma step, e.g. a plasma pretreatment, must also take place. In this step, using plasma, the surface is freed from contaminants, and the polymer is optionally activated for subsequent deposition of a metal, or the deposition of the Top Coat. This step is essential in an industrial process, because of the surface-cleaning and—activation effect.

It was moreover extremely surprising that substrate materials with different contents of bisphenol units of the formula (2) behave differently. It is necessary to establish optimized conditions for each different substrate material.

Surprisingly, the object was achieved through defined copolycarbonates which were treated by a specific process, and metalized. Metalized multilayer moldings obtained according to said process obtain a metal surface that is defect-free even at very high service temperatures above 160° C. and in particular in the range from 160° C. to 220° C. The object was achieved through a defined process with defined process parameters, with the aim of obtaining stable metal layers. The combination with defined pressures and defined power levels during pretreatment leads to better results.

The standard metalizing process comprises three steps:

1. Plasma pretreatment
2. Metalization
3. Deposition of a corrosion-protection layer The metal layer is typically applied from the vapor phase or DC-sputtered (cathode atomization by way of direct-voltage plasma). The same technical equipment is typically used for step 1 and 3. These steps are already well known from the prior art.

The invention achieves the object through a process which comprises at least the following steps:

a) Production of a molding made of a copolycarbonate (hereinafter also termed component S) with a Vicat softening point in accordance with DIN ISO 306 above 160° C., preferably above 165° C., with particular preference above 170° C. in a conventional extrusion or injection-molding process, preferably injection-molding process, at temperatures of from 280° C. to 360° C., preferably from 300° C. to 350° C., comprising as terminal group (chain terminator) a structural unit of the formula (1)

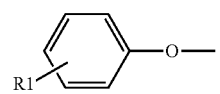

(1)

in which

R1 are hydrogen or $C_1$-$C_{18}$-alkyl; the structural unit of the formula (1) is very particularly preferably a phenolate moiety or a tert-butylphenolate moiety, or an n-butylphenolate moiety, in particular a phenolate moiety or a p-tert butylphenolate moiety, and comprises at least one bisphenol unit of the formula (2),

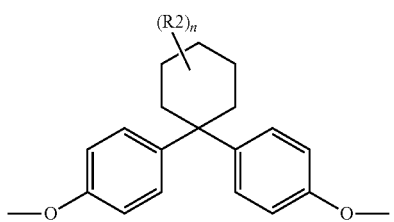

(2)

in which
R2 are $C_1$-$C_4$-alkyl, preferably methyl, ethyl, propyl, isopropyl, and butyl moieties, or else isobutyl moieties, particularly preferably methyl,
n are 0, 1, 2, or 3, preferably 2 or 3.

DETAILED DESCRIPTION OF A PREFERRED EMBODIMENT

Preferred bisphenol units of the formula (2) derive by way of example from 1,1-bis(4-hydroxyphenyl)cyclohexane and 1,1-bis(4-hydroxyphenyl)-3,3,5-trimethylcyclohexane, preferably 1,1-bis(4-hydroxyphenyl)-3,3,5-trimethylcyclohexane.

Preference is given here to copolycarbonates which comprise, based on the total weight of the bisphenol units, from 15% by weight to 95% by weight of bisphenol unit of the formula (2), with particular preference from 20% by weight to 88% by weight, and very particularly preferably from 25% by weight to 70% by weight, based on the total amount of bisphenols, where the total is 100%.

Suitable dihydroxyaryl compounds for the production of the copolycarbonates, other than the bisphenols of the formula (2), are those of the formula (3)

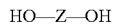  (3)

in which
Z is an aromatic moiety which has from 6 to 30 C atoms and which can comprise one or more aromatic nuclei, can have substitution, and can comprise aliphatic or cycloaliphatic moieties and, respectively, alkylaryl moieties or heteroatoms as bridging members.

It is preferable that Z in formula (3) is a moiety of the formula (3 a)

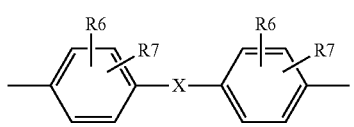  (3a)

in which
R6 and R7 are mutually independently H, $C_1$-$C_{18}$-alkyl-, $C_1$-$C_{18}$-alkoxy, halogens such as Cl or Br, or respectively optionally substituted aryl- or aralkyl, preferably H or $C_1$-$C_{12}$-alkyl, particularly preferably H or $C_1$-$C_8$-alkyl, and very particularly preferably H or methyl, and X is —SO$_2$—, —CO—, —O—, —S—, $C_1$- to $C_6$-alkylene, $C_2$- to $C_5$-alkylidene, or $C_6$- to $C_{12}$-arylene, which can optionally have been condensed with further aromatic rings comprising heteroatoms.

It is preferable that X is, $C_1$ to $C_5$-alkylene, $C_2$ to $C_5$-alkylidene, —O—, —SO—, —CO—, —S—, —SO$_2$—, isopropylidene, or oxygen, in particular isopropylidene.

Examples of suitable bisphenols of the formula (3) for the production of the copolycarbonates to be used in the invention are hydroquinone, resorcinol, bis(hydroxyphenyl)alkanes, bis(hydroxyphenyl) sulfides, bis(hydroxyphenyl) ethers, bis(hydroxyphenyl) ketones, bis(hydroxyphenyl) sulfones, bis(hydroxyphenyl) sulfoxides, [alpha],[alpha]'-bis (hydroxyphenyl)diisopropylbenzenes, and also ring-alkylated and other alkylated and ring-halogenated compounds related to these.

Preference is further given to the following bisphenols of the formula (3): 4,4'-dihydroxydiphenyl, 2,2-bis(4-hydroxyphenyl)-1-phenylpropane, 1,1-bis(4-hydroxyphenyl)phenylethane, 2,2-bis(4-hydroxyphenyl)propane, 2,2-bis(3-methyl, 4-hydroxyphenyl)propane, 2,4-bis(4-hydroxyphenyl)-2-methylbutane, 1,3-bis[2-(4-hydroxyphenyl)-2-propyl]benzene (bisphenol M), 2,2-bis(3-methyl-4-hydroxyphenyl)propane, bis(3,5-dimethyl-4-hydroxyphenyl)methane, 2,2-bis(3,5-dimethyl-4-hydroxyphenyl)propane, bis(3,5-dimethyl-4-hydroxyphenyl) sulfone, 2,4-bis(3,5-dimethyl-4-hydroxyphenyl)-2-methylbutane, 1,3-bis[2-(3,5-dimethyl-4-hydroxyphenyl)-2-propyl]benzene.

Particularly preferred bisphenols of the formula (3) are 2,2-bis(4-hydroxyphenyl)propane (BPA), and 2,2-bis(3-methyl, 4-hydroxyphenyl)propane.

Particular preference is given to copolycarbonates made of bisphenol A and bisphenol TMC. Preference is in particular given therefore to copolycarbonates which preferably, comprise, based on the total weight of the bisphenol units, from 15% by weight to 95% by weight, with particular preference from 20% by weight to 88% by weight, and very particularly preferably from 25% by weight to 70% by weight, of blocks derived from bisphenol TMC (based on the total amount of bisphenols), where the respective remaining proportion by weight is formed by bisphenol A, and the total of the proportions by weight of both bisphenol-derived blocks is always 100.

These and other suitable bisphenols are obtainable commercially and are described by way of example in "H. Schnell, Chemistry and Physics of Polycarbonates, Interscience Publishers, New York 1964, pp. 28 ff.; pp. 102 ff.", and in "D. G. Legrand, J. T. Bendler, Handbook of Polycarbonate Science and Technology, Marcel Dekker New York 2000, pp. 72 ff.".

Component S here can other polymer constituents. These polymer constituents are preferably polymers of the structures (I) and/or (II) and/or (V)

  (I)

  (II), in which A and B can be optionally substituted aromatic moieties. The aromatic moieties are composed of from 6 to 40 C atoms, preferably of from 6 to 21 C atoms, which comprise one or more optionally condensed aromatic nuclei, where the nuclei can optionally comprise heteroatoms. Said aromatic nuclei can optionally have substitution by linear or branched or cycloaliphatic $C_1$- to $C_{15}$-moieties or halogen atoms. The aromatic nuclei can be bonded by way of carbon bonds or by way of heteroatoms as bridging member.

A can by way of example be phenylene, alkylphenylene, alkoxyphenylene, or corresponding chlorine- or fluorine-substituted derivatives, preferably unsubstituted phenylene moieties.

B is preferably moieties which derive from bisphenols and which are based on the general formula (III) or (IV)

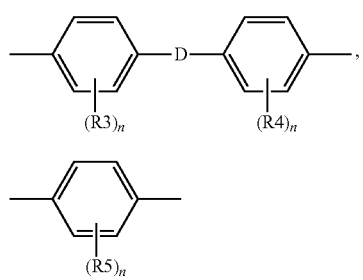

(III)

(IV)

where R3, R4, and R5 respectively mutually independently, being identical or different, is hydrogen, halogen, $C_1$-$C_6$-alkyl, or $C_1$-$C_6$-alkoxy-, preferably hydrogen, fluorine, chlorine, or bromine, n is an integer from 1 to 4, preferably 1, 2, or 3, in particular 1 or 2, D is a chemical bond —CO—, —O—, or —S—, preferably a single bond.

Polyetherimide of the formula (V)

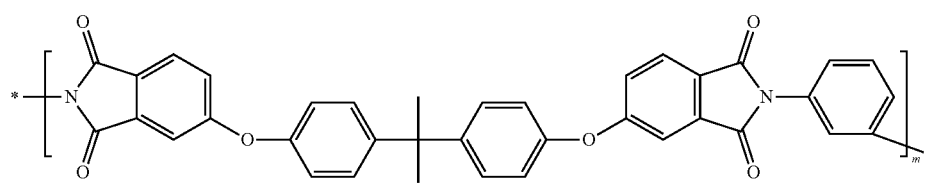

(V)

Preference is given here to polymers of the formula (I) where A is a phenylene moiety. These materials, known as polyether sulfones (CAS: 25608-63-3), are by way of example obtainable with trademark Ultrason® E 2010 from BASF SE (67056 Ludwigshafen, Germany).

Preference is further given to polymers of the formula (II) where A is a phenylene moiety and B is a phenylene moiety.

Preference is in particular given to polymers of the formula (II) where A is a phenylene moiety and B is a biphenylene moiety. These materials, known as polyphenyl sulfones (CAS 25608-64-4), are obtainable with trademark Radel® R (e.g. Radel® R 5900) from Solvay Advanced Polymers or Ultrason® P from BASF SE (67056 Ludwigshafen, Germany).

Polyetherimides of the formula (V) are by way of example known with trademark Ultem® (CAS 61128-46-9) (Sabic Innovative Plastics).

Mixtures of the abovementioned polymers are also possible.

The molar masses Mw (weight average Mw, determined by gel permeation chromatography GPC) of the thermoplastic copolycarbonates are from 12 000 to 120 000 g/mol, preferably from 15 000 to 80 000 g/mol, in particular from 18 000 to 60 000 g/mol, very particularly preferably from 18 000 to 40 000 g/mol. Another method of stating molar masses uses the number averages Mn, which are likewise determined by means of GPC after prior calibration to polycarbonate.

Component S can moreover comprise other additives, in particular low-molecular-weight additives.

Particular preference is given to the sole use of copolycarbonates made of bisphenol A and bisphenol TMC.

b) Pretreatment of the resultant molded part comprising a substrate material made of component S with, based on the total weight of the bisphenol units, a proportion by weight of from 15% by weight to 50% by weight of 1,1-bis(4-hydroxyphenyl)-3,3,5-trimethylcyclohexane, in a diode arrangement using medium-frequency excitation with an air- or argon-based plasma, preferably argon, at a frequency of from 0 Hz to 10 Mhz, preferably from 0 Hz to 1 Mhz, very particularly preferably from 0 Hz to 100 kHz at a power level of from 0.4 W/cm$^2$ to 8.4 W/cm$^2$, preferably from 0.5 W/cm$^2$ to 5.0 W/cm$^2$, with particular preference from 0.8 W/cm$^2$ to 4.2 W/cm$^2$, and a process gas pressure of from 0.04 to 0.4 mbar, preferably from 0.05 to 0.2 mbar, and with particular preference from 0.06 to 0.16 mbar. Process gases used are air, $N_2$, $N_2O$, Ar, He, and $O_2$, preferably air or argon, particularly preferably argon. The treatment time is from 10 seconds to 1000 seconds, preferably from 30 seconds to 500 seconds, and with particular preference from 30 seconds to 180 seconds.

Pretreatment of the resultant molded part comprising a substrate material made of component S with, based on the total amount of bisphenols used, a proportion by weight of from 51% by weight to 95% by weight of bisphenol blocks derived from 1,1-bis(4-hydroxyphenyl)-3,3,5-trimethylcyclohexane, a diode arrangement using medium-frequency excitation with an air- or argon-based plasma at a frequency of from 0 Hz to 10 Mhz, preferably from 0 Hz to 1 Mhz, very particularly preferably from 0 Hz to 100 kHz and at a power level of from 3.1 W/cm$^2$ to 8.3 W/cm$^2$, preferably from 3.2 W/cm$^2$ to 5 W/cm$^2$, with particular preference from 3.3 W/cm$^2$ to 4.2 W/cm$^2$, and a process gas pressure of from 0.04 to 0.15 mbar, preferably from 0.05 to 0.12 mbar. Process gases used are air, $N_2$, $N_2O$, Ar, He, and $O_2$, preferably air or argon, particularly preferably argon. The treatment time is from 10 seconds to 1000 seconds, preferably from 30 seconds to 500 seconds, and with particular preference from 30 seconds to 180 seconds.

c) Metalization of the molded part in a sputtering process in a DC magnetron in an argon plasma at a pressure of 5×10$^{-3}$ mbar, using aluminum, silver, chromium, titanium, or palladium, preferably using silver or aluminum, with particular preference aluminum with a process time of from 10 seconds to 1000 seconds.

The thickness of the metal layer is preferably from 10 nm to 1000 nm, preferably from 50 nm to 800 nm, with particular preference from 60 nm to 500 nm, and very particularly preferably from 60 nm to 300 nm.

d) Application of a protective layer (hereinafter also termed Top Coat) by the technical equipment described under b). This is achieved at a pressure of from 0.01 to 0.30 mbar, preferably with HMDSO (hexamethyldisiloxane; CAS 107-46-0) as coating material with a process time of from 10 seconds to 1000 seconds, preferably from 20 seconds to 500 seconds. The layer thickness of the Top Coat is from 5 nm to 200 nm, preferably from 20 nm to 100 nm.

The present application also provides multilayer systems comprising a layer i) comprising a substrate material made of component S or of a mixture of component S with polymers of the formula (I), (II) or (V) mentioned above or at a later stage below,
and also at least one layer ii) formed from a metal, where the metal is preferably composed of aluminum, silver, chromium, titanium, or palladium, preferably of aluminum, where alloys comprising said metals are also included here, and the metal was applied by the process of the invention.

The layer thickness of i) here is from 0.1 mm to 6.0 mm, preferably from 0.2 mm to 5.0 mm, and with particular preference from 0.5 mm to 4.0 mm.

The thickness of the layer ii) is preferably from 10 nm to 1000 nm, with particular preference from 30 nm to 500 nm, and very particularly preferably from 40 nm to 300 nm.

In one specific embodiment, the layer ii) bears a protective layer iii) composed of plasma-polymerized siloxanes of thickness from 5 nm to 200 nm, preferably from 15 nm to 150 nm, very particularly preferably from 20 nm to 100 nm.

In another specific embodiment, there can also be a layer iv) present which prevents condensation on the surface.

The multilayer structures obtained from the process of the invention have significantly improved thermal properties (Vicat softening point) in conjunction with good metalizability. Surface quality retained at even on exposure to high thermal stress. Mechanical, thermal and rheological properties here remain unaltered in comparison with the standard copolycarbonates (e.g. Apec).

These multilayer structures are in particular used in the production of reflectors, lamp holders, or lamp covers.

The polymer composition of the substrate material (component S) can comprise low-molecular-weight additives. However, it is preferable to operate with minimized amounts of additives. In one particular embodiment, the polymer composition comprises no additives. If said additives are optionally present, the preferred amounts, based on the weight of the copolycarbonate, are then in the range from 0.0% by weight to 5% by weight, preferably from 0.01% by weight to 1.00% by weight.

The following are preferably suitable as UV stabilizers: 2-(2'-hydroxyphenyl)benzotriazoles, 2-hydroxybenzophenones, esters of substituted and unsubstituted benzoic acids, acrylates, sterically hindered amides, oxamides, 2-(2-hydroxyphenyl)-1,3,5-triazines, particular preference being given to substituted benzotriazoles such as Tinuvin 360, Tinuvin 350, Tinuvin 234, Tinuvin 329, or UV CGX 006 (Ciba). In one particular embodiment, no mold-release agent is used.

It is moreover possible to add colorants, such as organic dyes or pigments or inorganic pigments, JR absorbers, individually, in a mixture, or else in combination with stabilizers, with (hollow) glass beads, or with inorganic fillers, or to add organic or inorganic scattering pigments. The composition of the invention here is preferably free from titanium dioxide.

The composition can comprise other commercially available polymer additives such as flame retardants, flame retardant synergists, antidripping agents (for example compounds of the substance classes of the fluorinated polyolefins, of the silicones, or else aramid fibers), nucleating agents, antistatic agents (for example carbon fibers, carbon nanotubes, conductive carbon blacks, or else organic antistatic agents such as polyalkylene ethers, alkylsulfonates, or polyamide-containing polymers) in amounts which do not impair the mechanical properties of the composition to such an extent that the targeted property profile is no longer achieved.

Suitable additives are described by way of example in "Additives for Plastics Handbook, John Murphy, Elsevier, Oxford 1999", in "Plastics Additives Handbook, Hans Zweifel, Hanser, Munich, 2001" or in WO 99/55772, pp. 15-25.

Other materials that can also be present in the composition, alongside the additives, are heat stabilizers and mold-release agents.

The following are preferably suitable as heat stabilizer: triphenylphosphine, tris(2,4-di-tert-butylphenyl) phosphite (Irgafos 168), tetrakis(2,4-di-tert-butylphenyl)[1,1 biphenyl]-4,4'-diylbisphosphonite, trisoctyl phosphate, octadecyl 3-(3,5-di-tert butyl-4-hydroxyphenyl)propionate (Irganox 1076), bis(2,4-dicumylphenyl) pentaerythritoldiphosphite (Doverphos S-9228), bis(2,6-di-tertbutyl-4-methylphenyl) pentaerythritoldiphosphite (ADK STAB PEP-36). They are used alone or in a mixture (e.g. Irganox B900 or Doverphos S-92228 with Irganox B900 and, respectively, Irganox 1076). Preference is in particular given to triphenylphosphine. In one particular embodiment, no heat stabilizer is used. If these heat stabilizers are optionally present, the preferred amounts, based on the weight of the copolycarbonate, are then in the range from 0.00% by weight to 0.20% by weight, preferably from 0.01% by weight to 0.10% by weight.

The following are preferably suitable as mold-release agents: pentaerythritol tetrastearate, glycerol monostearate, stearyl stearate, or propoanediol mono- or distearate. They are used alone or in a mixture. In one particular embodiment, no mold-release agent is used. If these mold-release agents are optionally present, the preferred amounts, based on the weight of the copolycarbonate, are then in the range from 0.00% by weight to 1.00% by weight, preferably from 0.01% by weight to 0.50% by weight, particularly preferably from 0.01% by weight to 0.40% by weight.

The thermoplastic molding compositions of the invention are produced by mixing the respective constituents in a known manner and, at temperatures of from 200° C. to 380° C., preferably from 240 to 350° C., in conventional assemblies such as internal mixers, extruders, and twin-screw equipment, compounding same in the melt, and extruding same in the melt.

The polymer compositions are in particular used for the production of components in which optical, thermal, and mechanical properties are utilized, examples being housings, articles in the electrical and electronics sector, such as plugs, switches, boards, lamp holders, lamp covers, automobile sector, examples being lamp holders and lamp covers, panels, and other applications.

The extrudates and moldings or molded parts made of the polymers of the invention are likewise provided by the present application.

The copolycarbonates of component S are produced by a continuous interfacial process. The production of the copolycarbonates to be used in the invention is in principle achieved in a known manner from bisphenols, carbonic acid derivatives, and optionally branching agents.

In general terms, the process for the synthesis of polycarbonate is known and is described in numerous publications. By way of example, EP 517 044 A1, WO 2006/072 344 A1, and EP 1 609 818 A1 and documents cited therein describe the interfacial and the melt process for the production of polycarbonate.

The bisphenols used, and also all of the other chemicals and auxiliaries added to the synthesis, can have contamination by contaminants deriving from the synthesis, handling, and storage of same. However, it is desirable to operate with raw materials of maximum purity.

Synthesis of the copolycarbonates is carried out continuously. The reaction can therefore take place in pumped-circulation reactors, tubular reactors, or stirred-tank cascades, or a combination of these, and it is necessary here to use the abovementioned mixing units to ensure that, as far as possible, demixing of aqueous and organic phase does not occur until the synthesis mixture has reacted to completion, i.e. no longer comprises any hydrolyzable chlorine from phosgene or from chlorocarbonic esters.

The amount of chain terminator to be used, based on moles of bisphenols respectively used, is from 0.5 mol % to 10 mol %, preferably from 1 mol % to 8 mol %, particularly preferably from 2 mol % to 6 mol %. The chain terminator can be added prior to, during, or after the phosgenation process, preferably in the form of solution in a solvent mixture made of methylene chloride and chlorobenzene (from 8 to 15% by weight).

EXAMPLES

The invention is described in more detail hereinafter by taking working examples, where the determination methods described here are used for all of the corresponding variables in the present invention, unless otherwise stated.

Melt volume rate (MVR) is determined according to ISO 1133 under the conditions stated below.

Materials:

Copolycarbonate component S:

Type 1: Copolycarbonate comprising 42% by weight of 1,1-bis(4-hydroxyphenyl)-3,3,5-trimethylcyclohexane and 58% by weight of bisphenol A with phenol as chain terminator and with an MVR of 18 cm$^3$/(10 min) (330° C.; 2.16 kg) according to ISO 1133 is compounded with, based on the weight of the copolycarbonate, 0.004% by weight of carbon black (Lampblack 101, Evonik Carbon Black GmbH, 60287 Frankfurt a. M., Germany, Color Index: 77262) and, based on the weight of the copolycarbonate, 0.1% by weight of titanium dioxide (Kronos 2230; Kronos International Inc., 51373 Leverkusen, Germany) under conditions described below. The Vicat softening point of the resultant material is 183° C. (ISO 306; 50 N; 120 K/h).

Type 2: Copolycarbonate comprising 67% by weight of 1,1-bis(4-hydroxyphenyl)-3,3,5-trimethylcyclohexane and 15% by weight of bisphenol A with phenol as chain terminator and with an MVR of 5 cm$^3$/(10 min) (330° C.; 2.16 kg) according to ISO 1133 is compounded with, based on the weight of the copolycarbonate, 0.004% by weight of carbon black (Lampblack 101, Evonik Carbon Black GmbH, 60287 Frankfurt a. M., Germany, Color Index: 77262) and, based on the weight of the copolycarbonate, 0.1% by weight of titanium dioxide (Kronos 2230; Kronos International Inc., 51373 Leverkusen, Germany) under conditions described below. The Vicat softening point of the resultant material is 203° C. (ISO 306; 50 N; 120 K/h).

Type 3: Copolycarbonate comprising 13% by weight of 1,1-bis(4-hydroxyphenyl)-3,3,5-trimethylcyclohexane and 87% by weight of bisphenol A with phenol as chain terminator and with an MVR of 46 cm$^3$/(10 min) (330° C.; 2.16 kg) according to ISO 1133 has a Vicat softening point of 158° C. Since the Vicat point of this polycarbonate is therefore below 160° C. and corresponding moldings undergo distortion at storage temperatures above 160° C., these copolycarbonates are unsuitable for the purposes of the process of the invention.

Compounding

The materials were compounded in a ZE25 twin-screw extruder from KraussMaffei Berstorff, at a barrel temperature of 320° C. or at a melt temperature of about 340° C. and at a rotation rate of 110 rpm with the amounts stated in the examples of components.

Production of Test Specimens

Metalization properties were studied by preparing optical-quality rectangular injection-molded plaques measuring 150×105×3.2 mm with side gating. Melt temperature was from 300 to 330° C., and mold temperature was 100° C. The respective pellets were dried at 120° C. in a vacuum drying oven for 5 hours before processing.

Measurement of Heat Resistance by Way of Vicat Softening Point

Vicat softening point according to DIN EN ISO 306 is measured with a needle (with circular area of 1 mm$^2$). A test force of 50 N (test force B) is applied thereto. The abovementioned test specimen is exposed to a defined heating rate of 120 K/h. The Vicat point has been reached when the penetration depth achieved by the penetrator is 1 mm. It is measured according to DIN ISO 306.

Metalizing Process

All of the plaques were stored for 21 days at 50% humidity and 23° C. prior to the coating process.

The coating system was composed of a vacuum chamber where the specimens were positioned on a rotating specimen holder. The specimen holder rotated at about 20 rpm. Ionized air was blown onto the test specimens to free them from dust before they were introduced into the vacuum chamber. The vacuum chamber with the test specimens was then evacuated to a pressure $p \leq 1 \cdot 10^{-5}$ mbar. Argon gas was then permitted to enter the system until a defined pressure as described in the working examples (process pressure 1) was reached, and a plasma was ignited at a defined power level defined in the working examples (process power level 1) for 2 min, and the specimens were exposed to said plasma (plasma pretreatment). Plasma source used comprised a diode arrangement composed of 2 parallel metal electrodes, and was operated with an alternating frequency of 40 kHz and with a voltage above 1000 V. The specimens were then metalized. For this, Ar gas was permitted to enter the system with a pressure of $5 \cdot 10^{-3}$ mbar. An aluminum layer of thickness about 100 nm was applied to the specimens by means of DC magnetron with a power density of 6.4 W/cm$^2$. The sputtering time was 2.5 min. A corrosion-protection layer made of HMDSO was then applied by means of plasma polymerization. For this, HMDSO was vaporized, and the vapor was permitted to enter the vacuum chamber until the resultant pressure was about 0.07 mbar. A plasma was then ignited, using the diode arrangement described above at 1000 W, the corrosion-protection layer applied during 1 minute.

Test for Surface Quality After Heat-Aging

The test is carried out directly after the metalizing process. This means that the plaques are subjected to this test within one hour after metalization.

In this test, the metalized plaques are aged in a chamber under controlled conditions for 3 hours at 45° C. and 100% relative humidity. Directly after this aging, the plaques are aged for one hour at 165 and, respectively, 185° C. in an oven.

The metal surface is then assessed.

Visual Assessment

The surface is studied for raised blister-type areas, clouding of the metal layer, and iridescence. Plaques exhibiting neither iridescence nor clouding nor blisters are characterized as "very good".

Example 1

Comparative Example

Rectangular injection-molded plaques are prepared from component S type 1 as described above.

The test specimens are then metalized as described above. Process pressure 1 here is 0.01 mbar and process power level 1 here is 0.17 W/cm$^2$. All of the other parameters for the production of the metal layer or production of the topcoat are set as described above.

Table 1 shows the result of the test (heat-aging).

Example 2

Comparative Example

Rectangular injection-molded plaques are prepared from component S type 1 as described above.

The test specimens are then metalized as described above. Process pressure 1 here is 0.04 mbar and process power level 1 here is 0.17 W/cm$^2$. All of the other parameters for the production of the metal layer or production of the topcoat are set as described above.

Table 1 shows the result of the test (heat-aging).

Example 3

Comparative Example

Rectangular injection-molded plaques are prepared from component S type 1 as described above. The test specimens are then metalized as described above. Process pressure 1 here is 0.12 mbar and process power level 1 here is 0.17 W/cm$^2$. All of the other parameters for the production of the metal layer or production of the topcoat are set as described above.

Table 1 shows the result of the test (heat-aging).

Example 4

Comparative Example

Rectangular injection-molded plaques are prepared from component S type 1 as described above. The test specimens are then metalized as described above. Process pressure 1 here is 0.12 mbar and process power level 1 here is 0.33 W/cm$^2$. All of the other parameters for the production of the metal layer or production of the topcoat are set as described above.

Table 1 shows the result of the test (heat-aging).

Example 5

Comparative Example

Rectangular injection-molded plaques are prepared from component S type 1 as described above. The test specimens are then metalized as described above. Process pressure 1 here is 0.01 mbar and process power level 1 here is 2.17 W/cm$^2$. All of the other parameters for the production of the metal layer or production of the topcoat are set as described above.

Table 1 shows the result of the test (heat-aging).

Example 6

Of the Invention

Rectangular injection-molded plaques are prepared from component S type 1 as described above. The test specimens are then metalized as described above. Process pressure 1 here is 0.12 mbar and process power level 1 here is 2.17 W/cm$^2$. All of the other parameters for the production of the metal layer or production of the topcoat are set as described above.

Table 1 shows the result of the test (heat-aging).

Example 7

Of the Invention

Rectangular injection-molded plaques are prepared from component S type 1 as described above. The test specimens are then metalized as described above. Process pressure 1 here is 0.16 mbar and process power level 1 here is 4.17 W/cm$^2$. All of the other parameters for the production of the metal layer or production of the topcoat are set as described above.

Table 1 shows the result of the test (heat-aging).

Example 8

Comparative Example

Rectangular injection-molded plaques are prepared from component S type 2 as described above. The test specimens are then metalized as described above. Process pressure 1 here is 0.12 mbar and process power level 1 here is 2.83 W/cm$^2$. All of the other parameters for the production of the metal layer or production of the topcoat are set as described above.

Table 1 shows the result of the test (heat-aging).

Example 9

Comparative Example

Rectangular injection-molded plaques are prepared from component S type 2 as described above. The test specimens are then metalized as described above. Process pressure 1 here is 0.16 mbar and process power level 1 here is 3.5 W/cm$^2$. All of the other parameters for the production of the metal layer or production of the topcoat are set as described above.

Table 1 shows the result of the test (heat-aging).

Example 10

Of the Invention

Rectangular injection-molded plaques are prepared from component S type 2 as described above. The test specimens are then metalized as described above. Process pressure 1 here is 0.12 mbar and process power level 1 here is 3.5 W/cm$^2$. All of the other parameters for the production of the metal layer or production of the topcoat are set as described above.

Table 1 shows the result of the test (heat-aging).

Example 11

Of the Invention

Rectangular injection-molded plaques are prepared from component S type 2 as described above. The test specimens are then metalized as described above. Process pressure 1 here is 0.12 mbar and process power level 1 here is 4.17 W/cm². All of the other parameters for the production of the metal layer or production of the topcoat are set as described above.

Table 1 shows the result of the test (heat-aging).

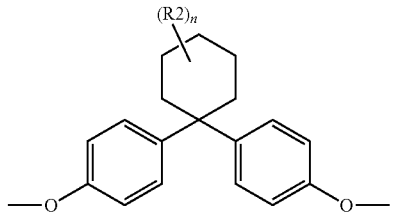

(2)

TABLE 1

| Ex. | Substrate | Pretreatment Sputtering process | Heat-aging temperature | Visual assessment |
|---|---|---|---|---|
| 1 comparison | component S type 1 | P power level 1: 0.17 W/cm² P pressure 1: 0.01 mbar | 165° C. | blisters iridescent |
| 2 comparison | component S type 1 | P power level 1: 0.17 W/cm² P pressure 1: 0.04 mbar | 165° C. | blisters iridescent |
| 3 comparison | component S type 1 | P power level 1: 0.17 W/cm² P pressure 1: 0.12 mbar | 165° C. | blisters iridescent |
| 4 comparison | component S type 1 | P power level 1: 0.33 W/cm² P pressure 1: 0.12 mbar | 165° C. | blisters iridescent |
| 5 comparison | component S type 1 | P power level 1: 2.17 W/cm² P pressure 1: 0.01 mbar | 165° C. | blisters |
| 6 of the invention | component S type 1 | P power level 1: 2.17 W/cm² P pressure 1: 0.12 mbar | 165° C. | no defect |
| 7 of the invention | component S type 1 | P power level 1: 4.17 W/cm² P pressure 1: 0.16 mbar | 165° C. | no defect |
| 8 comparison | component S type 2 | P power level 1: 2.83 W/cm² P pressure 1: 0.12 mbar | 185° C. | blisters |
| 9 comparison | component S type 2 | P power level 1: 3.5 W/cm² P pressure 1: 0.16 mbar | 185° C. | blisters |
| 10 of the invention | component S type 2 | P power level 1: 3.5 W/cm² P pressure 1: 0.12 mbar | 185° C. | no defect |
| 11 of the invention | component S type 2 | P power level 1: 4.17 W/cm² P pressure 1: 0.12 mbar | 185° C. | no defect |

When component S type 1 (42% by weight of 1,1-bis(4-hydroxyphenyl)-3,3,5-trimethylcyclohexane and 58% by weight of bisphenol A) is used as substrate material for the base layer it is found possible to obtain very good surface qualities at specific pressures and specific sputtering energies (examples 6 and 7). In particular higher sputtering energies are advantageous in combination with higher pressures. In contrast, surprisingly adverse surface effects occur with component S type 2 with a higher proportion by weight of 1,1-bis(4-hydroxyphenyl)-3,3,5-trimethylcyclohexane at higher pressures. Even process power levels (process power level 1) which have led to very good results in the case of type 1 exhibit adverse effects in the case of type 2. For the metalization of type 2 it is also necessary to increase the power level (process power level 1) to a marked extent, in order to produce good surface qualities.

What is claimed is:
1. A process for producing a multilayer structure, comprising processing a substrate material comprising a copolycarbonate which comprises at least one bisphenol unit of formula (2)

in which
R2 comprises C1-C4-alkyl,
n is 0, 1, 2, or 3,
and comprises as terminal group, a structural unit of formula (1)

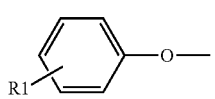

(1)

in which
R1 are hydrogen or C1-C18-alkyl,
and has a Vicat softening point in accordance with DIN ISO 306 above 160° C., to give a molding,
and pretreating said molding with an air- or argon-based plasma and then metalizing by a sputtering process in a DC magnetron,
wherein
(a) based on the total amount of the bisphenol blocks, from 15% by weight to 50% by weight of the substrate material is composed of a bisphenol unit derived from 1,1-bis(4-hydroxyphenyl)-3,3,5-trimethylcyclohexane and the plasma pretreatment uses medium-frequency excitation with an air- or argon-based plasma at a frequency of from 0 Hz to 10 Mhz at a power level of from 0.4 W/cm$^2$ to 8.4 W/cm$^2$ and a process gas pressure of from 0.04 to 0.4 mbar, or (b) based on the total amount of the bisphenol blocks, from 51% by weight to 95% by weight of the substrate material is composed of a bisphenol unit derived from 1,1-bis(4-hydroxyphenyl)-3,3,5-trimethylcyclohexane and the plasma pretreatment uses medium-frequency excitation with an air- or argon-based plasma at a frequency of from 0 Hz to 10 Mhz at a power level of from 3.1 W/cm$^2$ to 8.3 W/cm$^2$ and a process gas pressure of from 0.04 to 0.15 mbar.

2. The process as claimed in claim 1, wherein R2 is methyl, ethyl, propyl, isopropyl, and butyl, or isobutyl moiety, n is 2 or 3, provided that the structural unit of the formula (1) is a phenolate moiety or a tert-butylphenolate moiety, or an n-butylphenolate moiety, optionally a phenolate moiety or a p-tert-butylphenolate moiety.

3. The process as claimed in claim 1, wherein, based on the weight of the copolycarbonate, the copolycarbonate comprises from 0.01% by weight to 0.10% by weight of triphenylphosphine, and also from 0.01 to 0.4% by weight of pentaerythritol tetrastearate.

4. The process as claimed in claim 1, wherein, based on the weight of the copolycarbonate, the copolycarbonate comprises an amount of from 0.10% by weight to 2.50% by weight of titanium dioxide.

5. The process as claimed in claim 1, further comprising producing a metalized molded part.

6. The process as claimed in claim 1, wherein the multilayer structure also comprises, on a metal layer, a protective layer comprising one or more plasma-polymerized siloxanes.

7. The process as claimed in claim 6, wherein the thickness of a substrate layer is from 0.1 mm to 6.0 mm, the thickness of the metal layer is from 10 nm to 1000 nm, and the thickness of the protective layer is from 5 nm to 200 nm.

8. The process as claimed in claim 6, wherein the metal layer is an aluminum or silver layer.

9. The process as claimed in claim 6, further comprising producing a reflector, or a lamp holder or lamp cover.

10. The process as claimed in claim 1, wherein (a) is performed and said pretreating with plasma comprises using medium-frequency excitation with an air or argon-based plasma at a frequency of from 0 Hz to 1 Mhz at a power level of from 0.5 W/cm$^2$ to 5.0 W/cm$^2$ and a process gas pressure of from 0.05 to 0.2 mbar.

11. The process as claimed in claim 1, wherein (a) is performed and said pretreating with plasma comprises using medium-frequency excitation with an air or argon-based plasma at a frequency of from 0 Hz to 100 kHz at a power level of from 0.8 W/cm$^2$ to 4.2 W/cm$^2$ and a process gas pressure of from 0.06 to 0.16 mbar.

12. The process as claimed in claim 1, wherein (b) is performed and said pretreating with plasma comprises using medium-frequency excitation with an air or argon-based plasma at a frequency of from 0 Hz to 1 Mhz at a power level of from 3.2 W/cm$^2$ to 5.0 W/cm$^2$ and a process gas pressure of from 0.05 to 0.12 mbar.

13. The process as claimed in claim 1, wherein (b) is performed and said pretreating with plasma comprises using medium-frequency excitation with an air or argon-based plasma at a frequency of from 0 Hz to 100 kHz at a power level of from 3.3 W/cm$^2$ to 4.2 W/cm$^2$ and a process gas pressure of from 0.05 to 0.12 mbar.

14. The process as claimed in claim 1, wherein R2 is methyl, ethyl, propyl, isopropyl, and butyl, or isobutyl moiety, n is 2 or 3, and, if the structural unit of the formula (1) is a phenolate moiety or a p-tert-butylphenolate moiety.

15. The process as claimed in claim 1, wherein based on the total amount of the bisphenol blocks, from 15% by weight to 50% by weight of the substrate material is composed of a bisphenol unit derived from 1,1-bis(4-hydroxyphenyl)-3,3,5-trimethylcyclohexane and the plasma pretreatment uses medium-frequency excitation with an air- or argon-based plasma at a frequency of from 0 Hz to 10 Mhz at a power level of from 0.4 W/cm$^2$ to 8.4 W/cm$^2$ and a process gas pressure of from 0.04 to 0.4 mbar.

16. The process as claimed in claim 1, wherein based on the total amount of the bisphenol blocks, from 51% by weight to 95% by weight of the substrate material is composed of a bisphenol unit derived from 1,1-bis(4-hydroxyphenyl)-3,3,5-trimethylcyclohexane and the plasma pretreatment uses medium-frequency excitation with an air- or argon-based plasma at a frequency of from 0 Hz to 10 Mhz at a power level of from 3.1 W/cm$^2$ to 8.3 W/cm$^2$ and a process gas pressure of from 0.04 to 0.15 mbar.

\* \* \* \* \*